US011935615B2

(12) United States Patent
Guo et al.

(10) Patent No.: US 11,935,615 B2
(45) Date of Patent: Mar. 19, 2024

(54) THERMOMETER SAMPLE AND HOLD DESIGN FOR NON-VOLATILE MEMORY (71) Applicant: Intel Corporation, Santa Clara, CA (US)

(72) Inventors: Xiaojiang Guo, San Jose, CA (US); Weihua Shi, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 281 days.

(21) Appl. No.: 17/441,236

(22) PCT Filed: May 27, 2019

(86) PCT No.: PCT/CN2019/088530
§ 371 (c)(1),
(2) Date: Sep. 20, 2021

(87) PCT Pub. No.: WO2020/237456
PCT Pub. Date: Dec. 3, 2020

(65) Prior Publication Data
US 2022/0157350 A1 May 19, 2022

(51) Int. Cl.
G11C 7/00 (2006.01)
G01K 7/20 (2006.01)
G01K 13/00 (2021.01)
G11C 7/04 (2006.01)
G11C 7/10 (2006.01)

(52) U.S. Cl.
CPC .................. *G11C 7/04* (2013.01); *G01K 7/20* (2013.01); *G01K 13/00* (2013.01); *G11C 7/1063* (2013.01)

(58) Field of Classification Search
CPC ... G11C 7/04; G11C 11/406; G11C 11/40626; G11C 5/147; G11C 5/143

USPC .......................................................... 365/211
See application file for complete search history.

(56) References Cited

U.S. PATENT DOCUMENTS

| 4,848,923 | A | 7/1989 | Ziegler et al. |
| 10,013,194 | B1 | 7/2018 | Yang et al. |
| 10,528,099 | B2 * | 1/2020 | Fackenthal ............. G06F 3/061 |
| 2002/0057306 | A1 * | 5/2002 | McDonald ........... B41J 2/04563 |
| | | | 347/14 |
| 2016/0092130 | A1 * | 3/2016 | Choi ................... G11C 11/5635 |
| | | | 711/156 |
| 2018/0308555 | A1 * | 10/2018 | Zhang .................... G11C 16/26 |

FOREIGN PATENT DOCUMENTS

CN 106528323 A 3/2017

OTHER PUBLICATIONS

International Search Report and Written Opinion for PCT Patent Application No. PCT/CN19/88530, dated Feb. 26, 2020, 9 pages.
International Preliminary Report on Patentability for PCT Patent Application No. PCT/CN19/88530, dated Dec. 9, 2021, 5 pages.

* cited by examiner

*Primary Examiner* — Son T Dinh
(74) *Attorney, Agent, or Firm* — Akona IP PC (57) ABSTRACT

A sample and hold scheme for temperature measurements for non-volatile memory can enable significant reduction in temperature readout latency. In one example thermometer circuits are enabled at a refresh rate to cause the temperature to be sensed and latched at regular intervals. By performing the temperature readings in the background at a refresh rate instead of on-demand, the temperature is available to service commands with almost no latency.

20 Claims, 8 Drawing Sheets

United States Patent US 11,935,615 B2

THERMOMETER SAMPLE AND HOLD DESIGN FOR NON-VOLATILE MEMORY

CLAIM OF PRIORITY

This application is a U.S. National Phase application under 35 U.S.C. § 371 of International Application No. PCT/CN2019/088530 filed May 27, 2019, entitled "THERMOMETER SAMPLE AND HOLD DESIGN FOR NON-VOLATILE MEMORY," the entire contents of which are incorporated herein by reference.

FIELD

The descriptions are generally related to non-volatile storage media such as NAND flash memory.

BACKGROUND

Flash storage, such as NAND flash memory, is a non-volatile storage medium. Nonvolatile storage refers to storage having a state that is determinate even if power is interrupted to the device. Three-dimensional (3D) NAND flash memory refers to NAND flash memory in which a NAND string may be built vertically so that field effect transistors (FETs) of the string are stacked on top of one another. 3D NAND and other 3D architectures are attractive in part due to the significantly higher bit densities that can be achieved relative to two dimensional (2D) architectures. Thus, flash storage is increasingly being used across mobile, client, and enterprise segments. In addition to the high bit density, other metrics, such as low latencies, are also desirable in storage technologies.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" or "examples" are to be understood as describing a particular feature, structure, and/or characteristic included in at least one implementation of the invention. Thus, phrases such as "in one embodiment" or "in one example" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein.

DETAILED DESCRIPTION

A thermometer sample & hold circuit for a non-volatile memory is described.

A non-volatile memory die includes an on-die thermometer to detect temperature. The detected temperature can be used to perform temperature compensation for array operations or to provide the temperature to the controller (e.g., controller in the memory device) in response to a request. A thermometer sample & hold circuit enables the thermometer in the background for a short time to sense (sample) the temperature and latch the temperature (hold). At a certain refresh rate, the thermometer can be enabled periodically to refresh the temperature stored in the latches on the memory die. When a request is received at the memory die that requires a temperature reading, the temperature can then be read out of the latches without re-sampling the temperature to support a near-zero readout latency.

Figure 1:
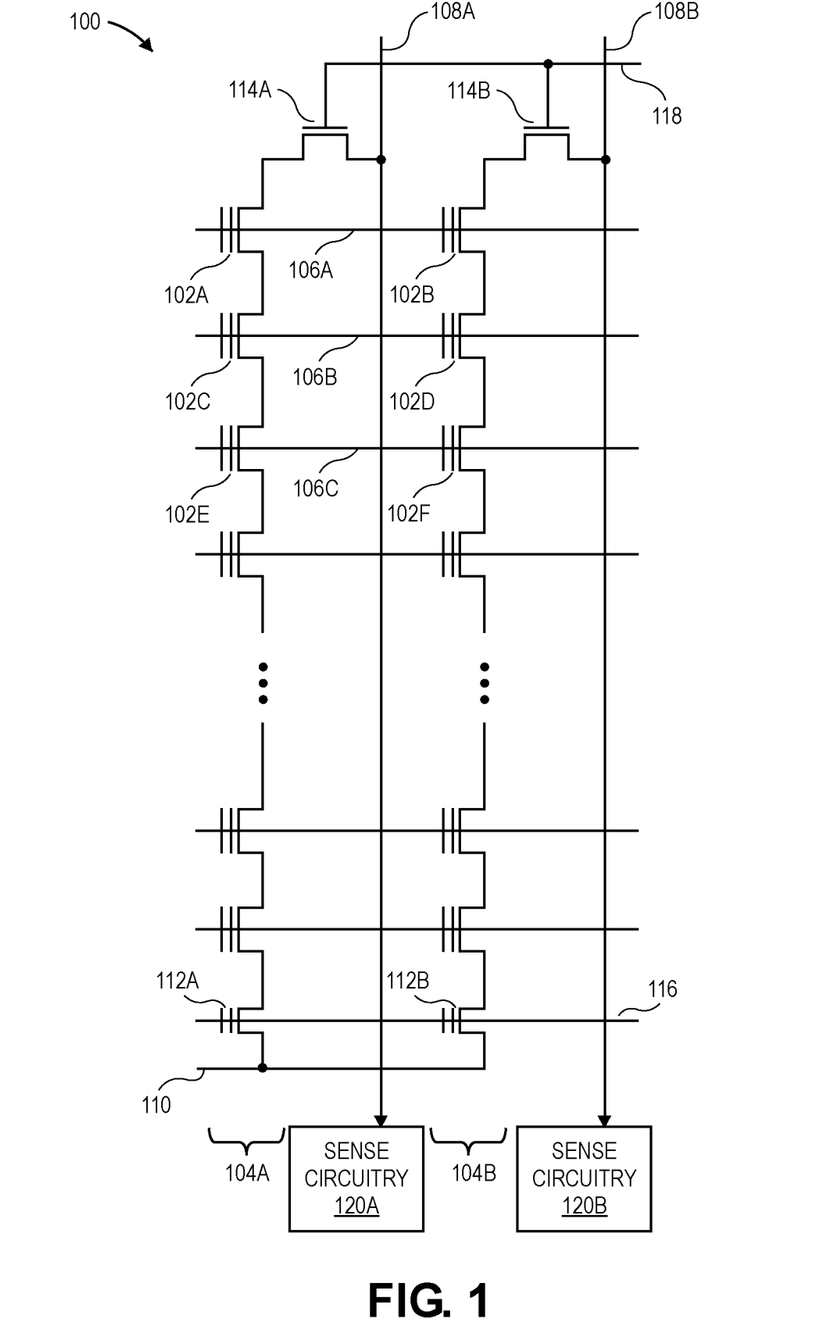
FIG. 1 depicts an example portion of a NAND flash memory array in which a thermometer sample and hold circuit can be implemented.

FIG. 1 depicts an example portion of a NAND flash memory array 100 in which a thermometer sample and hold circuit can be implemented. The NAND flash memory array 100 includes multiple non-volatile memory cells 102A-102F (abbreviated as 102) arranged in columns, such as series strings 104A and 104B (abbreviated as 104). In one example, the memory cell 102 includes a transistor with a replacement gate. A cell with a replacement gate typically has a low resistance gate (e.g., a tungsten gate) and a charge trap layer between the gate and the channel where charge is trapped or stored to represent one or more bit values. In another example, a memory cell 102 can include a transistor with a floating gate (e.g., a high resistance poly gate) that stores charge indicative of one or more bit values. Other architectures are also possible. In the series strings 104, drain regions of cells 102 are (with the exception of the top cell) coupled to a source region of another cell 102.

The array 100 also includes wordlines 106A-106C. The wordlines 106A-106C can span across multiple series strings 104 (e.g., a wordline may be coupled to one memory cell of each series string 104) and are connected to the control gates of each memory cell 102 of a row of the array 100 and used to bias the control gates of the memory cells 102 in the row. The bitlines 108A and 108B (abbreviated as 108) are each coupled to a series string 104 by a drain select gate 114 and sensing circuitry 120A and 120B that detects the state of each cell by sensing voltage or current on a particular bitline 108.

Multiple series strings 104 of the memory cells are coupled to a source line 110 by a source select gate 112A and 112B (abbreviated as 112) and to an individual bitline 108 by a drain select gate 114A and 114B (abbreviated as 114). The source select gates 112 are controlled by a source select gate control line 116 and the drain select gates 114 are controlled by a drain select gate control line 118.

In some examples, each memory cell 102 can be programmed according to various encoding schemes such as SLC (single level cell), MLC (multi-level cell) TLC (triple level cell), QLC (quad level cell), or other encoding scheme. Each cell's threshold voltage (Vt) is indicative of the data that is stored in the cell.

In one example, a cell state that is set to store multiple bits may form a part of multiple different pages, with each bit of the cell corresponding to a distinct page. For example, for a cell that is to enter a state to store 2 bits (e.g., using an MLC encoding scheme), one bit may correspond to an Upper Page (UP) and the other bit may correspond to a Lower Page (LP). For a cell that is to enter a state to store 3 bits (i.e., using a TLC encoding scheme), one bit may correspond to an LP, one bit may correspond to a UP, and the other bit may correspond to an Extra Page (XP). For a cell that is to store 4 bits (i.e., using a QLC encoding scheme), one bit may correspond to an LP, another bit may correspond to a UP, another bit may correspond to an XP, and the final bit may correspond to a Top Page (TP). Each page (e.g., LP, UP, XP, or TP) may include an aggregation of corresponding bits stored by a plurality of different cells of a wordline.

A programming sequence for a group of cells may include programming of all of the intended pages into the group of cells. A programming sequence may include one or more programming passes. A programming pass (which may include one or more programming loops) may program one or more pages. A programming pass may include the application of one or more effective program voltages to cells to be programmed followed by the application of one or more verify voltages to these cells in order to determine which cells have finished programming (subsequent programming passes generally will not apply an effective program voltage and/or a verify voltage to the cells that have finished programming). The application of an effective program voltage to a cell may include changing the voltage difference between a control gate and a channel of the cell in order to change the threshold voltage of the cell. Accordingly, a voltage of a wordline (coupled to the control gate of the target cell) and/or a channel of the cell may be set in order to effectuate application of an effective program voltage. As a program voltage is commonly used to refer to a voltage applied to a wordline, the effective program voltage can be the voltage difference between a control gate and channel of a cell (which in instances where the channel is held at 0 V can be synonymous with a program voltage).

Figure 2:
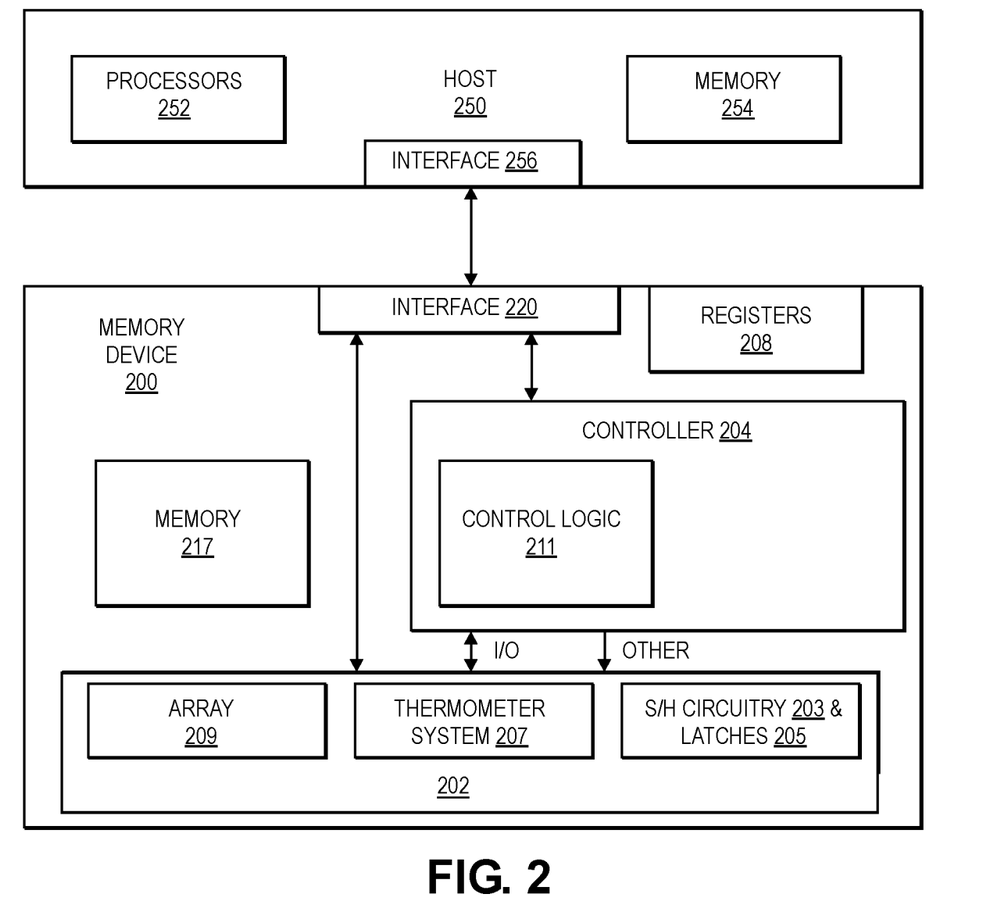
FIG. 2 depicts an example system.

FIG. 2 depicts an example system. The system includes a host 250 and a memory device 200. The host 250 and memory device 200 can be an example of a system that exists within the confines of a computer's package (e.g., within a laptop/notebook, server, or other computer). In other examples, the memory device 200 may also be accessed via a larger network such as a local area network (e.g., an Ethernet network), or a wide area network (such as a wireless cellular network, the Internet, etc.). Such examples may be in compliance with a standard such as NVMe-oF (non-volatile memory express over fabrics). The host 250 includes one or more processors 252, memory 254, and other components that are omitted from the drawing for clarity.

The memory device includes a memory medium 202 for storing data. Memory medium 202 can be a memory or storage medium that can store one or more bits in one or more arrays 209 of memory cells. For example, the memory medium 202 can include non-volatile and/or volatile types of memory. In one example, the memory medium 202 includes one or more non-volatile memory die. In some examples, the memory medium 202 can include block addressable memory devices, such as NAND technologies. In one example, the memory medium 202 includes a NAND flash memory array such as the array in FIG. 1. The memory medium 202 can also include non-volatile types of memory, such as 3D crosspoint memory (3DxP), or other byte addressable non-volatile memory. Other technologies, such as some NOR flash memory, may be byte addressable for reads and/or writes, and block addressable for erases. The memory medium 202 can include memory devices that use chalcogenide phase change material (e.g., chalcogenide glass), multi-threshold level NAND flash memory, NOR flash memory, single or multi-level phase change memory (PCM), a resistive memory, nanowire memory, ferroelectric transistor random access memory (FeTRAM), magneto resistive random access memory (MRAM) memory that incorporates memristor technology, or spin transfer torque MRAM (STT-MRAM), or a combination of any of the above, or other memory types. Memory medium 202 can include a single-level cell (SLC) NAND storage device, a multi-level cell (MLC) NAND storage device, triple-level cell (TLC) NAND storage device, quad-level cell (QLC) storage device.

According to some examples, volatile types of memory included in the memory medium 202 can include, but are not limited to, random-access memory (RAM), Dynamic RAM (D-RAM), double data rate synchronous dynamic RAM (DDR SDRAM), static random-access memory (SRAM), thyristor RAM (T-RAM) or zero-capacitor RAM (Z-RAM). Volatile types of memory may be compatible with a number of memory technologies, such as DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (LPDDR version 5, currently in discussion by JEDEC), HBM2 (HBM version 2, currently in discussion by JEDEC), and/or others, and technologies based on derivatives or extensions of such specifications.

The memory device 200 can communicate with a host system 250 using respective interfaces 220 and 256. In one example, the interface 256 is a part of a peripheral control hub (PCH). In the illustrated example, the controller 204 is coupled with a computing platform such as host 250 using the interface 220. In one example, the controller 204 is an ASIC (application specific integrated circuit). In one example, the interfaces are compliant with a standard such as PCI Express (PCIe), serial advanced technology attachment (ATA), a parallel ATA, universal serial bus (USB), and/or other interface protocol. The controller 204 can communicate with elements of the computing platform to read data from memory medium 202 or write data to memory medium 202. Although in this disclosure, the term "host" is referring to a system with a processor (or other device sending requests to access data stored in a non-volatile memory) and an interface for communicating with the NAND (e.g., the host 250), some implementations may refer to the controller 204 as a "host" relative to the non-volatile memory medium 202.

The controller 204 can be configured to receive requests from the host 250 and generate and perform commands concerning the use of memory medium 202 (e.g., to read data, write, or erase data). Other commands may include, for example, commands to read status, commands to change configuration settings, a reset command, etc. The controller can be implemented with hardware (e.g., logic circuitry), software, firmware, or a combination of hardware, software and firmware. Examples of logic circuitry include dedicated hardwired logic circuitry (including, e.g., one or more state machine logic circuits), programmable logic circuitry (e.g., field programmable gate array (FPGA), and a programmable logic array (PLA). In one example, logic circuitry is designed to execute some form of program code such as SSD firmware (e.g., an embedded processor, embedded controller, etc.). The memory device typically also includes memory 217 coupled to the logic circuitry 211 which can be used to cache NVM data and store firmware executed by the controller 204. The term "control logic" can be used to refer to both logic circuitry, firmware, software, or a combination. For example, control logic can refer to the control logic 211, firmware, or both.

The controller 204 is coupled with the memory medium 202 to control or command the memory to cause operations to occur (e.g., read, program, erase, suspend, resume, and other operations). Communication between the memory medium 202 and the controller 204 may include the writing to and/or reading from specific registers (e.g., registers 208). Such registers may reside in the controller 204, in the memory medium 202, or external to the controller 204 and the memory medium 202. Registers or memory within the memory medium 202 may be reachable by the controller 204 by, e.g., an internal interface of the memory device 200 that exists between the controller 204 and memory medium 202 (e.g., an Open NAND Flash Interface (ONFI) interface, a proprietary interface, or other interface) to communicatively couple the controller 204 and memory medium 202. Input/output (I/O) pins and signal lines communicatively couple the controller 204 with the memory medium 202 to enable the transmission of read and write data between the controller 204 and the memory medium 202. The I/O pins may also be used to transmit other data, such as status information. The memory medium 202 can also include other pins such as command pins (e.g., command latch enable (CLE), address latch enable (ALE), chip enable (CE #), read enable (RE #), and write enable (WE #)), power and ground pins (e.g., Vcc, Vss, etc.). In one example, the memory medium includes a pin for indicating ready/busy status. However, in implementations with many memory dies in a package, it is often impractical to use a dedicated ready/busy pin for each die. Instead, in some examples, status can be output on the I/O pins of the dies in response to a request to read status.

The controller 204 can be coupled to word lines of memory medium 202 to select one of the word lines, apply read voltages, apply program voltages combined with bit line potential levels, or apply erase voltages. The controller 204 can be coupled to bit lines of memory medium 202 to read data stored in the memory cells, determine a state of the memory cells during a program operation, and control potential levels of the bit lines to promote or inhibit programming and erasing. Other circuitry can be used for applying selected read voltages and other signals to memory medium 202.

In the illustrated example, the non-volatile memory medium also includes a thermometer system 207. A thermometer system includes a thermal sensor to sense or detect the temperature of the memory medium 202. In one such example, each memory die includes one sensor to detect the temperature of the die. In other examples, a thermal sensor may be used for multiple dies or multiple (e.g., 2 or more) thermal sensors may be included for each die. In one example, the thermal sensor is on-die (e.g., internal to the die). The thermometer system also include logic (circuitry, firmware, or both) to control the thermal sensor.

In a conventional NAND device, the temperature of a die is measured in response to a request. For example, the NAND device measures the temperature to perform array operations (such as program, read, verify, and erase operations). The NAND device also measures the temperature in response to a specific request from the controller to read the temperature (e.g., read status or "get feature" commands).

Regarding the NAND array operations, the temperature is typically read prior to performing the operations because the threshold of a NAND cell is a function of temperature. During read or verify operations, the NAND die modulates the Word Line (WL) and/or Bit Line (BL) voltages with temperature information to obtain similar string current at different temperatures. This process can be referred to as tempco (temperature coefficient) compensation. A typical 3D NAND Flash memory product employs an on-die thermometer to detect temperature and applies a certain algorithm to do temperature compensations to meet the cross-temperature performance. When the device is activated and receives array operation commands including read, program and erase, the NAND thermometer system is enabled and starts to sense the temperature. The delay to obtain the temperature may significantly impact the performance of array operations. For example, the process of enabling and sensing temperature after receiving an array operation command may take several micro seconds (e.g., 4-5 us or more) depending on the thermometer architecture. The NAND on-die firmware can latch the temperature when it is ready and use it to do temperature compensation.

In addition, the system can send commands to NAND Flash memory to read out the device temperature. The system also needs to wait for this latency after the command. Thus, both array operations and commands to read out the device temperature can experience significant latency due to the delay for detecting the die temperature.

In contrast, a sample & hold scheme can be used to reduce the temperature readout latency. The memory medium 202 also includes sample and hold circuitry 203 to control when and how frequently a temperature reading is made and latches 205 to store the temperature readings. In one example, the sample and hold circuitry 203 includes a standby oscillator (e.g., a sample & hold (S/H) oscillator) that stays on in the background to monitor the time. At a certain pre-defined refresh rate, temperature sensor circuits (e.g., circuits of the thermometer system 207) are enabled and the temperature is sensed. Once the temperature is read, the temperature bits are latched in latches 205 and stored on the memory 202 (e.g., on the NAND die). If a temperature readout command is issued by the system, the memory can send out the latched temperature bits, reducing the temperature readout latency to almost zero.

Figure 3:
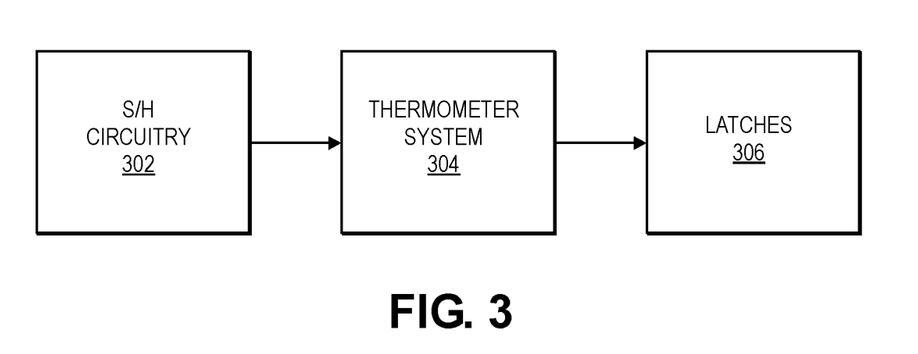
FIG. 3 illustrates an example of a sample & hold scheme.

FIG. 3 illustrates an example of a sample & hold scheme. In the example illustrated in FIG. 3, Sample & Hold (S/H) circuitry 302 generates one or more signals to sample the temperature of the non-volatile memory device at regular intervals with the thermometer system 304 and cause the sampled temperature to be stored in the latches 306. The thermometer system 304 includes at least one thermometer, which can also be referred to as a thermal sensor or temperature sensor. In one example, the thermal sensor is internal to a memory die (e.g., an on-die thermal sensor that is internal to a NAND die).

Unlike conventional systems in which the temperature is only read in response to a command, the scheme illustrated in FIG. 3 regularly measures the temperature in the background with a certain predetermined frequency. Measuring the temperature in the background at regular intervals enables reliable temperature readings to be available with very little latency. As mentioned above, for NAND systems, it is desirable to have the NAND temperature as early as possible to enable on-die firmware to set the tempco-compensated voltage/current targets internally. Reducing thermometer latency can significantly improve the NAND performance. It's beneficial to system performance as well if we can reduce this latency. Although a typical thermal sensor on a NAND die is used to sense the temperature of that particular NAND die, it is also possible to use the NAND thermometer to sense system temperature as well (e.g., by removing a dedicated system temperature sensor and relying on the NAND thermometer, system cost can be reduced). For example, if the NAND memory has a temperature sensor that is sufficiently accurate, then a system-level temperature sensor (such as a dedicated temperature sensor for the system of FIG. 2) may be eliminated and the host can obtain a temperature reading from the NAND instead of from a dedicated system-level temperature sensor. In such a system, latency reduction in temperature sensing would be even more important.

Figure 4:
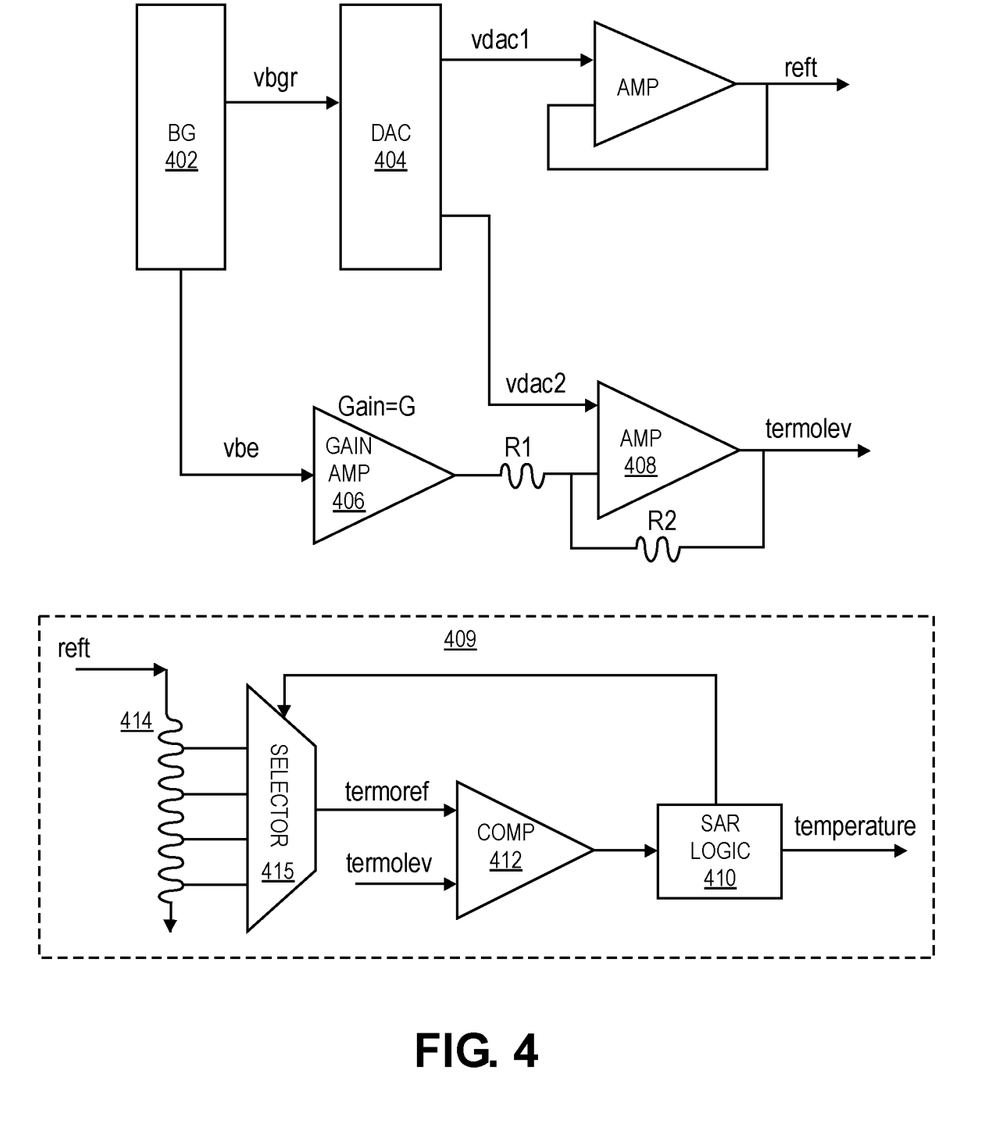
FIG. 4 illustrates an example of a thermometer system in a non-volatile memory die or device.

FIG. 4 illustrates an example of a thermometer system in a non-volatile memory die or device. The thermometer system is one example of thermometer system 304 of FIG. 3.

The thermometer system illustrated in FIG. 4 includes a bandgap reference generator (BG) 402 to generate a temperature-independent voltage reference vbgr. The voltage reference vbgr becomes an input to the Digital-to-Analog Converter (DAC) 404. DACs can create many different temperature independent reference voltages (vdacs). In the illustrated example, the DAC generates vdac1 and vdac2. These voltage references are widely used in NAND chip to generate bias voltages.

In one example, the thermometer is designed with a resistor ladder ADC. In one such example, one of the vdac reference voltages is used to create the analog voltage at the top of resistor ladder 414 (reft). The voltages between resistors in the resistor ladder are inputs to the selector 415. For the thermometer, an analog signal which has temperature dependence can be used. In one example, ideally a signal which has linear dependence to temperature is used. In one example, the bandgap reference generator generates an analog voltage, vbe, which can serve the purpose of a temperature dependent analog signal. In one example, Vbe is given by:

$$Vbe = VG0 - VT[(\gamma-\alpha)\ln T - \ln(EG)]$$

where α, γ, E, G are temperature independent parameters. So Vbe is inversely proportional to the temperature with the temperature range −40° C. to 130° C., which is a typical range for a NAND die.

By applying gain (e.g., with gain amplifier 406) and inversion (e.g., with inverter 408) to Vbe, we generate "termolev", which is linearly proportional to temperature. In one example, Vtermolev is given by:

$$Vtermolev = \left(1 + \frac{R2}{R1}\right) Vdac2 - G * \frac{R2}{R1} * Vbe$$

The thermometer in the illustrated example then employs a SAR ADC architecture 409 to convert "termolev" to temperature bits that can then be latched after the SAR logic 410 completes the conversion. The autozero and chopping techniques are used on the op-amp and comparator 412 of the SAR ADC to cancel the random offset. Autozero and chopping techniques can greatly improve the accuracy of the thermometer system. After the thermometer system is enabled, we need to wait some time for the temperature to be ready. The time delay includes, for example, the active bandgap settling time, DAC settling time, "termolev" settling time, and the thermometer SAR ADC conversion time. In one such example, the delay for the temperature to be ready is at least 4-5 us. It is very difficult to reduce this time delay further without sacrificing accuracy or increasing power consumption.

The thermometer system of FIG. 4 is one example of a system that can be sampled at regular intervals in the background. A sample and hold scheme can be implemented with any thermometer system in which a temperature is sensed and is stored (e.g., in latches or other storage elements).

Figure 5:
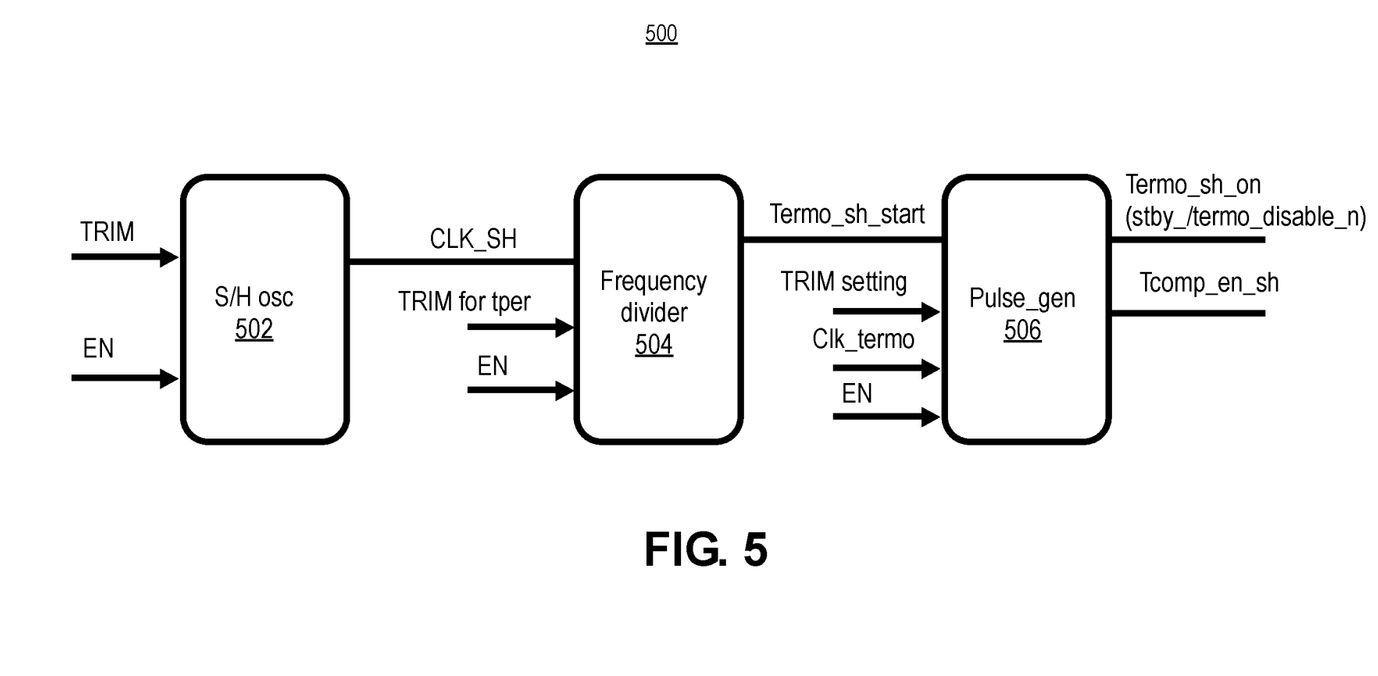
FIG. 5 illustrates an example of sample & hold (S/H) circuitry for a memory thermometer system.

FIG. 5 illustrates an example of sample & hold (S/H) circuitry for a memory thermometer system. In one such example, the circuitry 500 is a NAND thermometer sample and hold system, such as the S/H circuitry 302, which outputs signals to the memory thermometer system 304.

In the example illustrated in FIG. 5, the sample & hold circuitry includes a S/H oscillator 502, a frequency divider 504, and a pulse generator 506. In the illustrated example, the oscillator 502 receives an enable (EN) signal and a TRIM signal. The enable signal enables or disables the oscillator depending on the logic value asserted. In one example, the oscillator 502 is on (enabled) even during low power or standby modes. Thus, the oscillator 502 stays on in the background and generates the S/H system clock CLK_SH. The TRIM signal adjusts the clock frequency (cycle time) of the clock signal CLK_SH. In one example, the CLK_SH is designed with a trimmable range of 30 us to 60 us. In an example where the thermometer latency is 4-5 us, one CLK_SH clock cycle is long enough to complete the thermometer internal operations. In one example, the TRIM signal is based on a value stored in a register.

The system clock CLK_SH goes into a frequency divider 504 and generates a signal "termo_sh_start" at a trimmable (e.g., programmable or adjustable) period. In one example, the termo_sh_start signal has a frequency that is half of the CLK_SH signal. The signal "termo_sh_start" is a sample/hold start signal that triggers the sample_hold_on signal to enable the circuits required for thermal sensing. The other inputs to the frequency divider 504 include "TRIM for tper", which adjusts how often the sample/hold start signal (termo_sh_start) is triggered and enable (EN) to enable the frequency divider.

The sample/hold start signal is input to the pulse generator 506, which, as mentioned above, triggers the termo_sh_on signal to turn on the thermometer circuits. The pulse generator also generates the Tcomp_en_sh signal to indicate to the latches that the temperature is ready to latch. In addition to the termo_sh_start signal, other inputs to the pulse generator include TRIM setting, Clk_termo, and an enable (EN) signal. The TRIM setting controls how long the thermal sample/hold (termo_sh_on) signal is to stay on (e.g., asserted to a logic value to turn on the thermometer circuits). In one example, when termo_sh_on is high, the system consumes more power because more circuit blocks are enabled. In the illustrated example, the pulse generator also receives the CLK_termo signal, which is the clock that the temperature sensor depends on. In one such example, the termo_sh_on signal is based on both the trim setting and the CLK_termo signal. The enable signal enables the pulse generator 506. In one example, the same enable signal enables the oscillator 502, the frequency divider 504, and the pulse generator 506.

Figure 6:
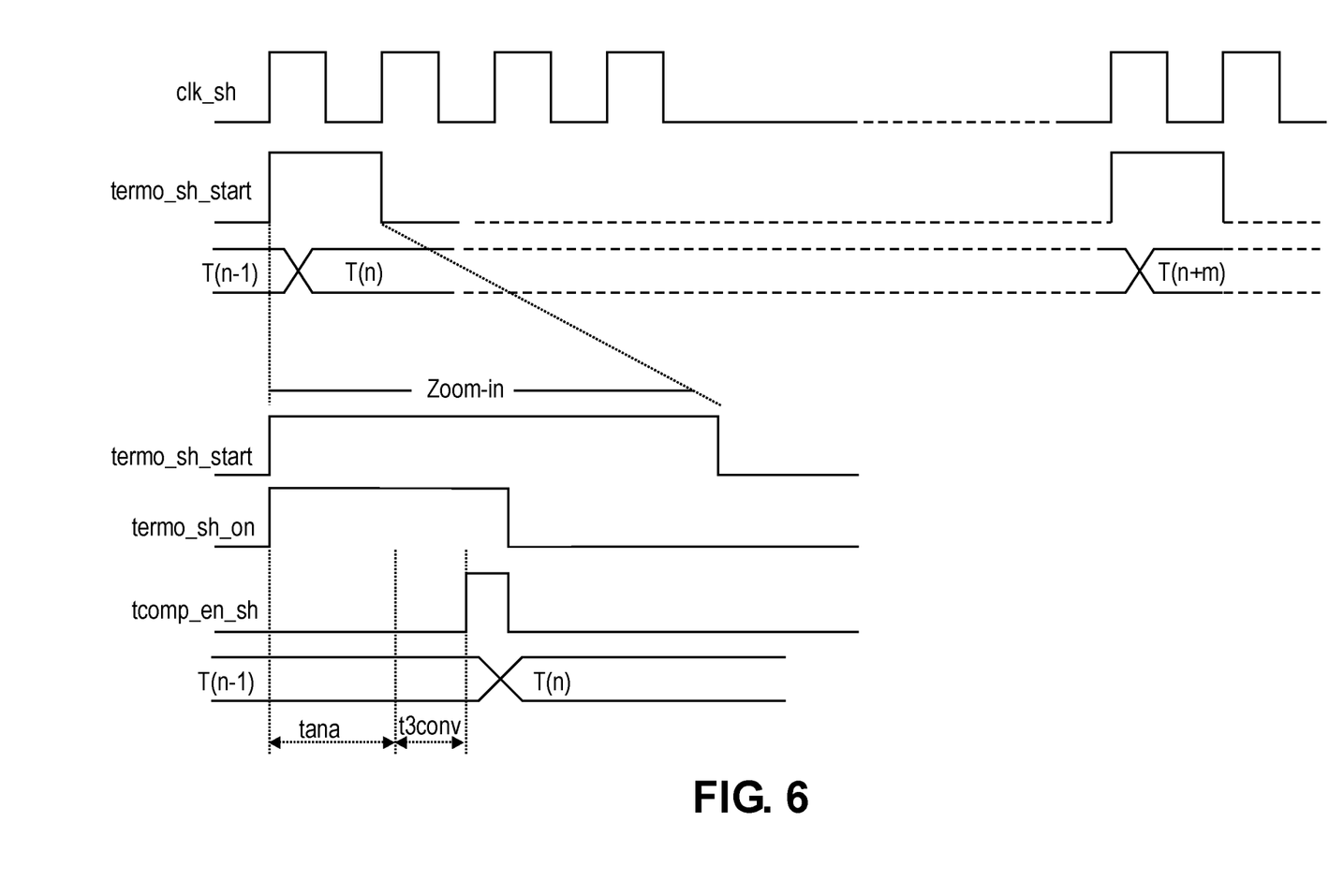
FIG. 6 illustrates a control sequence for the S/H circuitry.

FIG. 6 illustrates a control sequence for the S/H circuitry illustrated in FIG. 5. In the illustrated example, a clock clk_sh (such as generated by the oscillator 502 of FIG. 5) triggers the pulses termo_sh_start. For example, the rising edge of clk_sh triggers the termo_sh_start signal. In the illustrated example, a pulse of the signal termo_sh_start is one clock cycle of clk_sh. However, the pulse of termo_sh_start can be shorter or longer than one clock cycle of clk_sh (e.g., 0.75 or 2 clock cycles of clk_sh). In one example, each pulse of termo_sh_on is 30-60 is at a pre-defined period, which can be adjusted based on the trim settings. In the illustrated example, the termo_sh_on signal goes to a pulse generator (e.g., the pulse generator 506 of FIG. 5) to generate thermometer control signals. For example, the control signal "termo_sh_on" enables the thermometer system (e.g., turns the thermometer system on). The control signal "tcomp_en_sh" is used to latch the temperature bits (e.g., after Successive-approximation-register (SAR) analog-to-digital converter (ADC) conversion). In the illustrated example, there is a delay between the rising edge of termo_sh_on and the tcomp_en_sh pulse. Specifically there is a "tana" (time analog) delay that represents the time to enable the analog circuitry of the thermometer system (e.g., the bandgap reference generator (BG), digital to analog converter (DAC), or other analog circuitry). The delay "t3conv" represents the time to convert the sensed temperature from an analog value to a digital value that can be latched. After the delays to ensure the temperature is ready to be latched, the tcomp_en_sh pulse causes the next temperature reading to be latched (T(n)).

The process continues with each clock cycle to cause the temperature reading in the latches to be regularly updated in the background. In one example, with the sample and hold system working in background including during standby, the temperature reading is ready when it is needed. In one example, the temperature is refreshed at a certain pre-defined rate by enabling the temperature sensor circuits, sensing the temperature, and then latching the temperature. Once the temperature is latched, the thermometer circuits can be disabled to save power. If a temperature readout command is issued by the system (e.g., by a NAND controller) the NAND can just simply send out the latched temperature bits. Therefore, the temperature readout latency is almost zero. For NAND array operations, the on-die firmware can just fetch the stored temperature bits at the beginning of operations without waiting for the latency. Thus, a sample-and-hold temperature scheme can reduce or eliminate the thermometer bottleneck for NAND performance.

One possible drawback to have the thermometer circuits running in background is the increased standby current (Iccs). In one example, to minimize the standby current impact, most of the thermometer related circuits are disabled after the temperature sample/hold operation is complete. In one such example, the only circuit that is left enabled is the sample/hold oscillator. The standby Iccs from this scheme can be calculated as:

$$Iccs = Icc \text{ (active blocks)} * \frac{Ttermo_{on}}{Tsh_{cyc}} + Icc(osc_{sh})$$

where Icc (active blocks) represent the active current from blocks supporting thermometer operations, Ttermo_on represents the enablement time for thermometer to settle and latch, Tsh_cyc represents the cycle time of sample/hold operation. Icc(osc_sh) is the current of sample/hold oscillator.

Some circuits need to be enabled for thermometer operations. In one example, the active bandgap, iref generator, DACs, and thermometer are enabled to sense the temperature. In one such example, an active vcc regulator (avdc) and state machine oscillator that clocks the thermometer SAR ADC is also enabled to sample the temperature. In one such example, the total ICC from these blocks when activated is ~1 mA.

The sample/hold refresh rate (the rate at which the temperature is sensed) can be determined based on the temperature drift rate in the NAND system. Temperature drift is typically a slow event in a NAND system (e.g., temperature drift for a typical NAND system is in the order of hundreds of milliseconds per degree of temperature change). The thermometer circuitry only needs to be activated during the refresh window. In one example, the thermometer is enabled once every X ms, where X is a value based on one or more factors, including a register setting. In one such example, when the thermometer is enabled, it stays on for some predetermined period of time to enable the temperature to be sensed and latched. The S/H oscillator can be carefully designed to minimize Icc so that the thermometer sample/hold system has a very small impact to the total NAND standby current.

Figure 7:
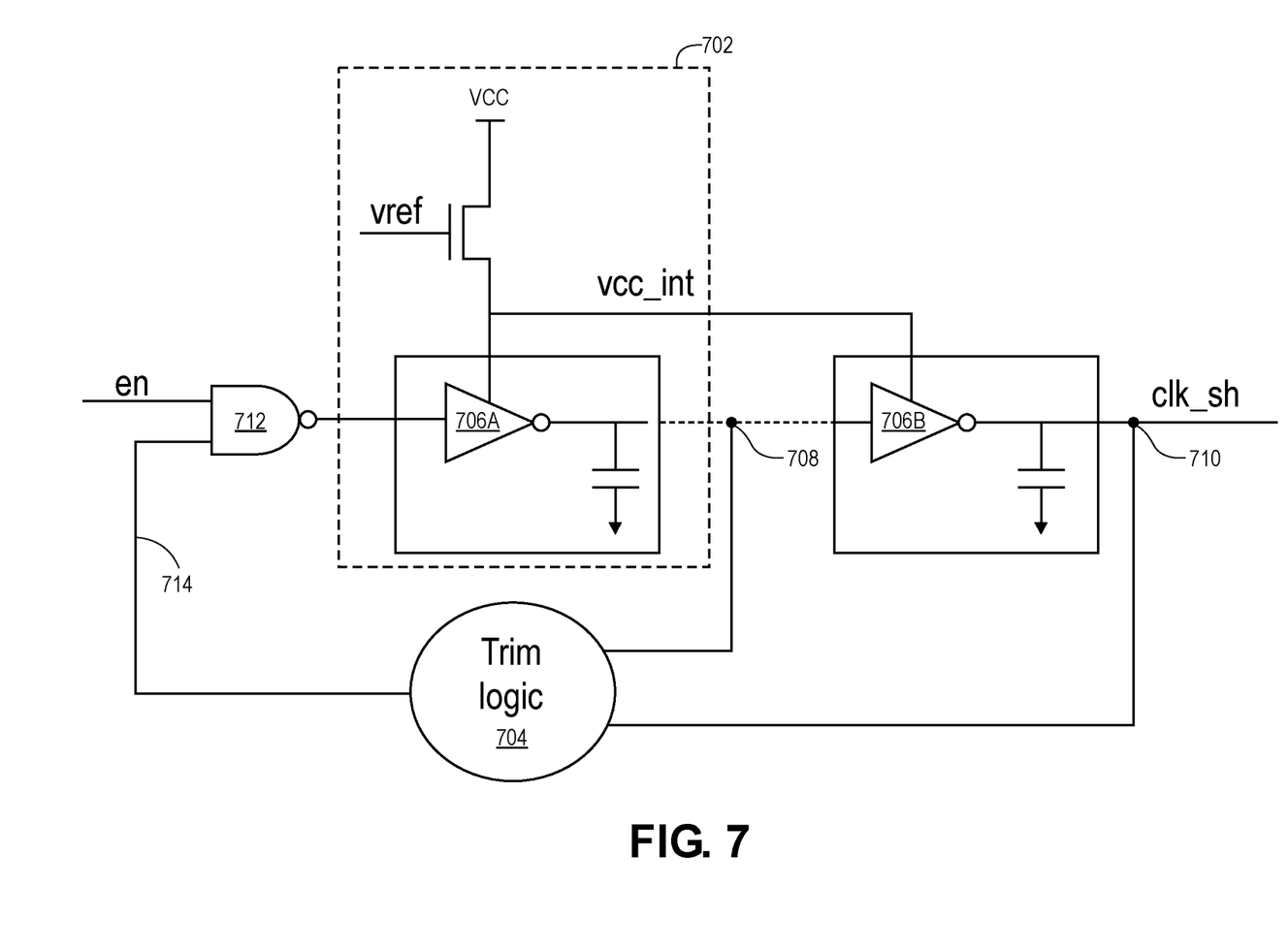
FIG. 7 illustrates an example of a sample & hold oscillator.

FIG. 7 illustrates an example of a sample & hold oscillator. The oscillator illustrated in FIG. 7 is one example of a S/H oscillator for generating a clock in a sample & hold scheme for a thermometer system, such as the oscillator 502 of FIG. 5.

From the above standby current impact analysis, the design of the S/H oscillator can be critical to keep standby current within an acceptable range. In one example, it is not required to have a high accuracy oscillator for the thermometer sample & hold system, but it is desirable to have a low power design. The oscillator in FIG. 7 is one example of a simple and low-power design. In the example illustrated in FIG. 7, a source follower (also known as a common drain amplifier) 702 is used to create a lower internal supply of vcc_int. In one such example, the internal voltage ½ to ⅕ times the external voltage VCC. In one such example, the internal voltage is ~1.3 V and VCC is 3-5V. In the illustrated example, the voltage vref comes from NAND standby bandgap circuit (e.g., BG 402 of FIG. 4), which is enabled at all time (e.g., during operation and standby). In one such example, the voltage Vref is ~1.25 V. In one such example, a zero Vt NMOS is used as the source follower, which produces an internal power supply of ~1.3 V. The illustrated oscillator design is based on a ring oscillator architecture. The illustrated oscillator includes a NAND (not AND) gate followed by two inverters 706A and 706B. Other oscillator designs may include more than two inverters. Assuming the enable signal (en) is initially low (a logic 0) and the voltage at point 710 is high (logic 1) at a given start time t0, the initial output of the NAND gate 712 is logic 1 and the voltage at point 708 is low. When the enable transitions to a logic 1 and remains at a logic 1 during operation and standby, the output of the NAND gate 712 transitions to a logic 0. Thus, the transition of the enable signal from logic 0 to logic 1 causes the outputs at points 708 to 710 to toggle after a gate delay associated with the inverters 706A and 706B. When the feedback signal 714 is a logic 0, the output of the NAND gate 712 is a logic 1, and when the feedback signal 714 is a logic 1, the output of the NAND gate 712 is a logic 0. Because the output of the NAND gate 712 depends on the feedback signal 714, the toggling of the outputs at points 708 and 710 results in an oscillating output clk_sh. Trimming logic 704 is added to pick the feedbacks to close the loop of ring oscillator. For example, the trim logic 704 can cause the feedback voltage 714 to be either the voltage at point 708 or the voltage at point 710 with, for example, a multiplexer. The select signals of such a multiplexer can be based on values stored in one or more register bits to change the frequency of clk_sh. By selecting different feedback points, different clock cycles can be selected. The Icc from this oscillator can be calculated as follow:

$$Icc = C*V*f$$

where C is the total capacitance in the ring oscillator, V is the internal Vcc (vcc_int), and f is the target frequency of clk_sh. In one example, total Icc from the oscillator is about 0.7 uA.

Figure 8:
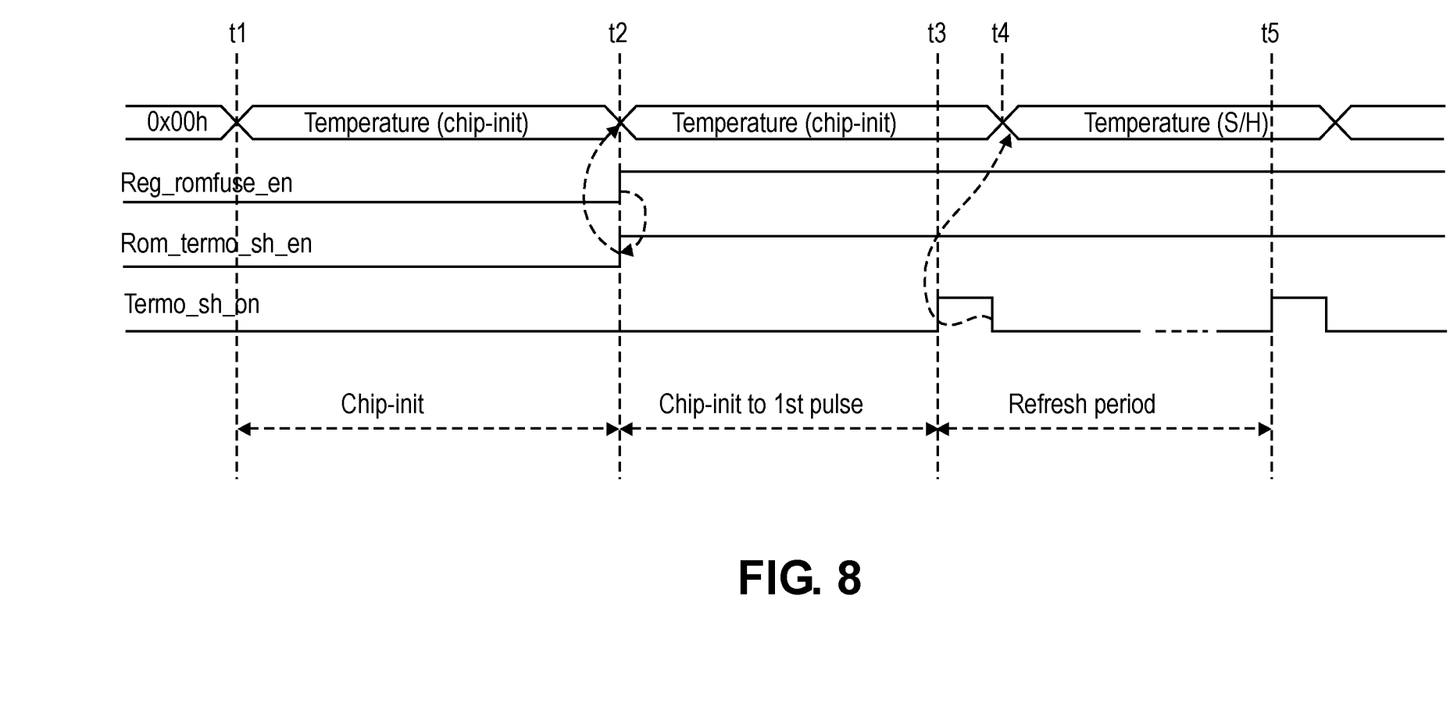
FIG. 8 is a timing diagram illustrating the handshake of a sample & hold scheme during chip initialization.

FIG. 8 is a timing diagram illustrating the handshake of a sample & hold scheme for a NAND thermometer system during chip initialization. During chip power up, the sample and hold circuitry (e.g., S/H circuitry 302 of FIG. 3) for the thermometer system does not need to be enabled. During chip initialization, firmware (e.g., NAND firmware) can be relied on to read out the temperature. The temperature read during initialization (e.g., at time t1) may not be very accurate because trims have not yet been loaded. In one example, the NAND reads out the on-chip trims during chip initialization, then loads them into corresponding trim registers. The signal "reg_romfuse_en" will go high after a chip initialization period at time t2 to indicate that the correct trims have been loaded, so we can do an accurate thermometer sense operation. When the thermometer sample hold scheme is in default mode, "rom_termo_sh_en" will go high after "Reg_romfuse_en" goes high. In one example, the sample/hold clock system is designed to have one thermometer sample hold event at this time. After a delay (e.g., of 50 us or so), the termo_sh_on signal will go high at time t3, which triggers a more accurate temperature to be sampled and latched at time t4. Therefore, by the time chip initialization is completed, the NAND will have the correct temperature latched on die in the sample/hold temperature latches. The temperature is then re-sampled at a pre-defined refresh rate. In the illustrated example, after a refresh period the termo_sh_on goes high again at time t5 to trigger the next temperature reading.

Figure 9:
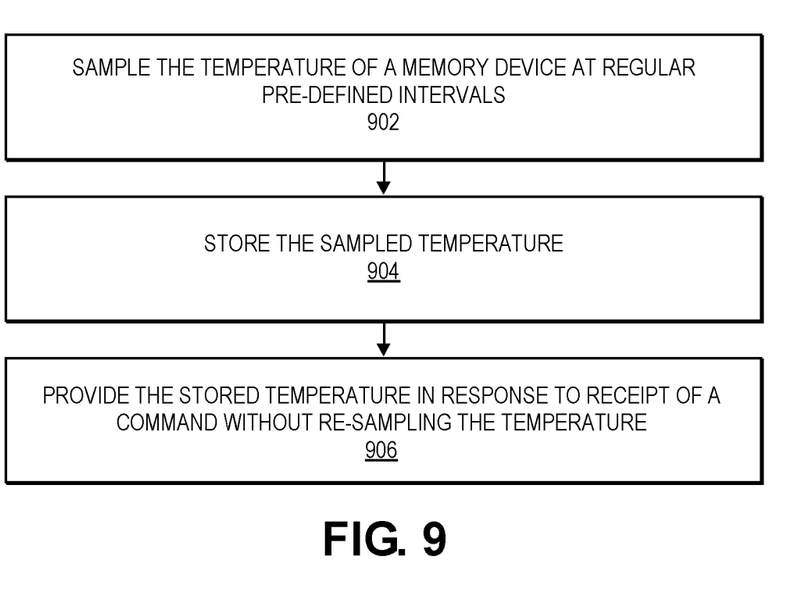
FIG. 9 is a flow diagram of an example of a method of background temperature measurement for a non-volatile memory device.

FIG. 9 is a flow diagram of an example of a method of temperature measurement for a non-volatile memory device. The operations of the method can be performed by hardware, firmware, software, or a combination of hardware, firmware, and/or software. In one implementation all the operations of the method are performed by hardware (e.g., circuitry). For example, the operations can be performed by S/H circuitry, latches, and thermometer circuitry, such as illustrated in FIGS. 3, 4, 5, and 7.

The method begins with regularly sampling the temperature of the memory device or die at regular pre-defined intervals, at operation 902. For example, a sample and hold system, such as in FIG. 5, can generate pulses to cause the temperature to be sensed at regular intervals. In one example, the regular intervals at which the temperature is sensed is independent of any command that traditionally triggered a temperature reading. For example, the circuitry senses the temperature regardless of whether a read, get feature, etc., command was received. The sensing of the temperature is not triggered by a command, but rather is sampled regularly in the background. The sampled temperature is then stored, at operation 904. For example, the sampled temperature is stored in latches or other storage elements so that the temperature is available when a request is received.

The method then involves providing the stored temperature in response to receipt of a command without re-sampling the temperature, at operation 906. Providing the temperature can involve, for example, outputting the temperature on pins of a memory die, storing the temperature in a register, or sending the temperature as inputs to internal control circuitry. For example, if a command to read the temperature is received by a NAND die from a NAND controller, the NAND die can output the temperature stored in the latches on the I/O pins without needing to obtain a new temperature reading. For example, the system (e.g., NAND ASIC controller) can issue a "get feature" command to read out the NAND temperature. Since the correct temperature is already latched in the thermometer sample/hold latch, the NAND does not need to enable the thermometer after receiving the temperature readout command. Instead, the NAND sends out the most recently latched temperature to the system from the sample/hold latches. Therefore, the temperature readout latency is greatly reduced.

In another example, if a command to perform an array operation (e.g., a program, read, or erase command) is received, the latched temperature can be provided on the inputs of internal circuitry to generate appropriate voltages for performing the array operations. As mentioned above, during typical NAND array operations, the temperature is used to do internal tempco compensation. At the beginning of a read, programming or erase sequence, the NAND controller (e.g., a controller internal to the NAND die) will fetch the temperature bits from sample/hold latches and provide them to a set of dedicated latches and use this temperature to complete the entire algo operations. Since the thermometer sample/hold operations are enabled, it is possible to have a thermometer sample/hold event in the middle of algo operation. However, in one such example, the NAND controller will not fetch this new temperature. Even if the temperature bits stored in the latches are updated during a NAND operation, it should typically not be problematic because the longest NAND array operation does not take very long (e.g., only a few ms). In such an example, the new temperature stored in the latches would be used in the next operation.

Figure 10:
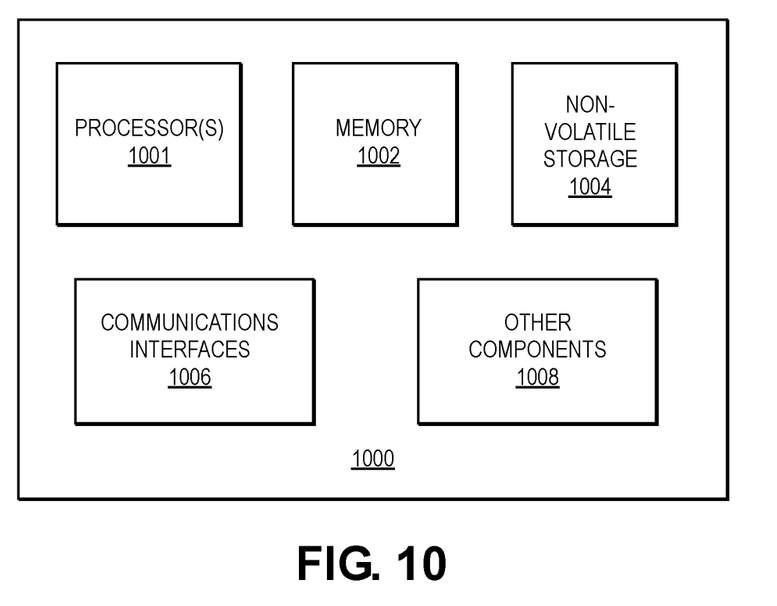
FIG. 10 provides an exemplary depiction of a computing system in which thermometer sample and hold techniques described can be implemented.

FIG. 10 provides an exemplary depiction of a computing system 1000 (e.g., a smartphone, a tablet computer, a laptop computer, a desktop computer, a server computer, etc.). As observed in FIG. 10, the system 1000 may include one or more processors or processing units 1001. The processor(s) 1001 may include one or more central processing units (CPUs), each of which may include, e.g., a plurality of general-purpose processing cores. The processor(s) 1001 may also or alternatively include one or more graphics processing units (GPUs) or other processing units. The processor(s) 1001 may include memory management logic (e.g., a memory controller) and I/O control logic. The processor(s) 1001 can be similar to, or the same as, the processor 252 of FIG. 2.

The system 1000 also includes memory 1002 (e.g., system memory), non-volatile storage 1004, communications interfaces 1006, and other components 1008, which may also be similar to, or the same as, components of the host 250 of FIG. 2. The other components may include, for example, a display (e.g., touchscreen, flat-panel), a power supply (e.g., a battery or/or other power supply), sensors, power management logic, or other components. The communications interfaces 1006 may include logic and/or features to support a communication interface. For these examples, communications interface 1006 may include one or more communication interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more standards promulgated by IEEE. For example, one such Ethernet standard may include IEEE 802.3. Network communication may also occur according to one or more OpenFlow specifications such as the OpenFlow Switch Specification. Other examples of communications interfaces includes, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system also includes non-volatile storage 1004, which may be the mass storage component of the system. The non-volatile storage 1004 can be similar to, or the same as, the memory device 200 of FIG. 2, described above. The non-volatile storage 1004 includes one or more non-volatile memory (storage) arrays. The non-volatile storage 1004 can include a solid state drive (SSD), a dual in-line memory module (DIMM), or other non-volatile storage. Non-volatile storage 1004 may include byte or block addressable types of non-volatile memory having a 3-dimensional (3D) cross-point memory structure that includes chalcogenide phase change material (e.g., chalcogenide glass) hereinafter referred to as "3D cross-point memory". Non-volatile types of memory may also include other types of byte or block addressable non-volatile memory such as, but not limited to, multi-threshold level NAND flash memory (e.g., 3D NAND flash memory), NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), or a combination of any of the above. In one example, the non-volatile storage 1004 may include mass storage that is composed of one or more SSDs. SSDs can be composed of flash memory chips that implement a sample and hold thermometer scheme as described above.

A thermometer sample and hold scheme and techniques for implementation are discussed above. In one example, a low power oscillator is enabled in the background to count the time. A thermometer is enabled periodically to sample (sense) the temperature and latch it. This way, the temperature is always ready when needed. For example, the NAND controller can fetch it at the beginning of array operation to do tempco compensation. The NAND controller can also fetch it and send out to system upon a temperature readout command. Near-zero thermometer latency can be achieved by this scheme.

Examples of thermometer sample and hold schemes and techniques follow. In one example, a non-volatile memory device includes a non-volatile memory array, a thermal sensor to detect a temperature of the non-volatile memory device, and circuitry to: sample the temperature of the non-volatile memory device at regular intervals, store the sampled temperature, and output the stored temperature in response to receipt of a command. In one example, the circuitry is to sample and store the temperature at regular intervals independent of receipt of commands. In one example, the circuitry is to sample and store the temperature prior to receipt of the command and output the stored temperature without re-sampling the temperature. In one example, the command includes a program, read, erase, read status, or get feature command. In one example, the circuitry to sample the temperature includes an oscillator to generate a clock signal, wherein the regular intervals at which the temperature is to be sampled are based on the clock signal. In one example the circuitry to sample the temperature further includes: a frequency divider to receive the clock signal and output a signal to turn on thermometer circuitry. In one example, the circuitry to sample the temperature further includes: a pulse generator to receive the output of the frequency divider and generate a pulse to trigger sampling of the temperature. In one example, the circuitry to store the sampled temperature includes latches. In one example, the non-volatile memory array comprises a three-dimensional (3D) NAND array, and the thermal sensor includes an on-die thermal sensor on a 3D NAND die. In one example, the regular intervals at which the temperature is sampled is based on values stored in one or more registers.

In one example, a three-dimensional (3D) NAND die includes a 3D NAND memory array, a thermal sensor to detect a temperature of the 3D NAND die, and circuitry to: sample the temperature of the 3D NAND die at regular intervals, store the sampled temperature, and output the stored temperature in response to receipt of a command. In one example, a system includes a processor, and a non-volatile memory device in accordance with an example described above.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

Flow diagrams as illustrated herein provide examples of sequences of various process actions. The flow diagrams can indicate operations to be executed by a software or firmware routine, as well as physical operations. In one example, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various examples; thus, not all actions are required in every embodiment. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A non-volatile memory device comprising:
a non-volatile memory array;
a thermal sensor to detect a temperature of the non-volatile memory device; and
circuitry to:
sample the temperature of the non-volatile memory device at regular intervals,
store the sampled temperature, and
output the stored temperature in response to receipt of a command;
wherein the circuitry to sample the temperature includes:
an oscillator to generate a clock signal, wherein the regular intervals at which the temperature is to be sampled are based on the clock signal, and
a frequency divider to receive the clock signal and output a signal to turn on thermometer circuitry.

2. The non-volatile memory device of claim 1, wherein:
the circuitry is to sample and store the temperature at regular intervals independent of receipt of commands.

3. The non-volatile memory device of claim 1, wherein:
the circuitry is to sample and store the temperature prior to receipt of the command and output the stored temperature without re-sampling the temperature.

4. The non-volatile memory device of claim 1, wherein:
the command includes a program, read, erase, read status, or get feature command.

5. The non-volatile memory device of claim 1, wherein:
the circuitry to sample the temperature further includes: a pulse generator to receive the output of the frequency divider and generate a pulse to trigger sampling of the temperature.

6. The non-volatile memory device of claim 1, wherein:
the circuitry to store the sampled temperature includes latches.

7. The non-volatile memory device of claim 1, wherein:
the non-volatile memory array comprises a three-dimensional (3D) NAND array; and
the thermal sensor includes an on-die thermal sensor on a 3D NAND die.

8. The non-volatile memory device of claim 1, wherein:
the regular intervals at which the temperature is sampled is based on values stored in one or more registers.

9. A three-dimensional (3D) NAND die comprising:
a 3D NAND memory array;
a thermal sensor to detect a temperature of the 3D NAND die; and
circuitry to:
sample the temperature of the 3D NAND die at regular intervals,
store the sampled temperature, and
output the stored temperature in response to receipt of a command;
wherein the circuitry to sample the temperature includes:
an oscillator to generate a clock signal, wherein the regular intervals at which the temperature is to be sampled are based on the clock signal, and
a frequency divider to receive the clock signal and output a signal to turn on thermometer circuitry.

10. The 3D NAND die of claim 9, wherein:
the circuitry is to sample and store the temperature at regular intervals independent of receipt of commands.

11. The 3D NAND die of claim 9, wherein:
the circuitry is to sample and store the temperature prior to receipt of the command and output the stored temperature without re-sampling the temperature.

12. The 3D NAND die of claim 9, wherein:
the command includes a program, read, erase, read status, or get feature command.

13. The 3D NAND die of claim 9, wherein:
the circuitry to sample the temperature further includes: a pulse generator to receive the output of the frequency divider and generate a pulse to trigger sampling of the temperature.

14. The 3D NAND die of claim 9, wherein:
the circuitry to store the sampled temperature includes latches.

15. A system comprising:
a processor; and
a non-volatile memory device comprising:
a non-volatile memory array;
a thermal sensor to detect a temperature of the non-volatile memory device; and circuitry to:

sample the temperature of the non-volatile memory device at regular intervals,
store the sampled temperature, and
output the stored temperature in response to receipt of a command from the processor;
wherein the circuitry to sample the temperature includes:
an oscillator to generate a clock signal, wherein the regular intervals at which the temperature is to be sampled are based on the clock signal, and
a frequency divider to receive the clock signal and output a signal to turn on thermometer circuitry.

16. The system of claim 15, wherein:
the circuitry is to sample and store the temperature at regular intervals independent of receipt of commands from the processor.

17. The system of claim 15, wherein:
the circuitry is to sample and store the temperature prior to receipt of the command and output the stored temperature without re-sampling the temperature.

18. The system of claim 15, wherein:
the command includes a program, read, erase, read status, or get feature command.

19. The system of claim 15, further comprising:
one or more of a display and a power supply.

20. The non-volatile memory device of claim 1, further comprising:
control logic to send the command and receive the stored temperature.

* * * * *